US005958209A

United States Patent [19]
Sakai et al.

[11] Patent Number: 5,958,209
[45] Date of Patent: Sep. 28, 1999

[54] HIGH TENSILE STRENGTH ELECTRODEPOSITED COPPER FOIL AND PROCESS OF ELECTRODEPOSITING THEREOF

[75] Inventors: Hisao Sakai, Saitama; Toshiko Yokota; Tsutomu Asai, both of Ageo; Susumu Takahashi, Kawagoe; Mitsuo Suzuki, Sakuda; Makoto Dobashi; Yasuji Hara, both of Ageo, all of Japan

[73] Assignee: Mitsui Mining & Smelting Co., Ltd., Ageo, Japan

[21] Appl. No.: 08/855,316

[22] Filed: May 13, 1997

[30] Foreign Application Priority Data

May 13, 1996 [JP] Japan .................................. 8-141198

[51] Int. Cl.$^6$ .............................. C25C 1/12; C25D 3/58; C25D 3/38; C25D 1/04
[52] U.S. Cl. ......................... 205/585; 205/241; 205/296; 205/77
[58] Field of Search ................................... 205/241, 296, 205/585, 77

[56] References Cited

U.S. PATENT DOCUMENTS

| | | | |
|---|---|---|---|
| 2,475,974 | 7/1949 | Max ........................................ | 204/52 |
| 2,482,354 | 9/1949 | Max et al. ............................... | 204/52 |
| 2,563,360 | 8/1951 | Phillips et al. ........................... | 204/52 |
| 2,859,159 | 11/1958 | Wernlund ................................ | 204/44 |
| 2,876,178 | 3/1959 | McCoy ..................................... | 204/52 |
| 3,864,227 | 2/1975 | Brytczuk et al. ...................... | 204/108 |
| 4,082,591 | 4/1978 | Morisaki et al. ...................... | 156/150 |
| 4,088,544 | 5/1978 | Hutkin ..................................... | 204/12 |
| 4,169,018 | 9/1979 | Berdan et al. .......................... | 204/13 |

(List continued on next page.)

FOREIGN PATENT DOCUMENTS

| | | |
|---|---|---|
| 0 207 244 A2 | 1/1987 | European Pat. Off. . |
| 0 250 195 A2 | 12/1987 | European Pat. Off. . |
| 52-33074 | 3/1977 | Japan . |
| 54-38053 | 11/1979 | Japan . |
| 61-52387 | 3/1986 | Japan . |
| 63-310989 | 12/1988 | Japan . |
| 63-310990 | 12/1988 | Japan . |
| 2-182890 | 7/1990 | Japan . |
| 4-32155 | 5/1992 | Japan . |
| 7-54183 | 2/1995 | Japan . |
| 7-188969 | 7/1995 | Japan . |
| WO 91/19204 | 12/1991 | WIPO . |

OTHER PUBLICATIONS

Supplementary European Search Report for Application No. EP 91 91 1599, dated Jan. 29, 1993.
Chemical Abstract No. 105:14254j, Masataka, Okada et al., Manufacture Of Electrolytic Copper Foils For Printed Circuits Having Good Elongation At High Temperature (Mar. 15, 1986).
Anderson, Dennis, et al., Tensile Properties Of Acid Copper Electrodeposits, Journal of Applied Electrochemistry, vol. 15, pp. 631–637 (1985). No month available.
Bennett, C. W., Tensile Strength Of Electrolytic Copper On A Rotating Cathode, Trans. Am. Electrochem. Soc., vol. 21, pp. 253–274 (1912). No month available.
Bucci, G. D., et al., Copper Foil Technology, PC Fab, pp. 22, 27–30 and 33 (Jul. 1986).

(List continued on next page.)

Primary Examiner—Kathryn Gorgos
Assistant Examiner—Edna Wong
Attorney, Agent, or Firm—Arnold White & Durkee

[57] ABSTRACT

A high tensile strength copper foil having a matte side roughness Rz of 2.5 μm or less and a tensile strength of 40,000 Kgf/mm$^2$ after heating one hour at 180° C. is produced by a process in which copper is electrodeposited from a solution containing predetermined small amounts of a polyether glycol and tin and iron ions. The chloride ion content is maintained below 0.1 wt. ppm. The copper foil is characterized by having copper crystals with atomic cells having a predominantly (111) orientation.

6 Claims, 5 Drawing Sheets

U.S. PATENT DOCUMENTS

| | | | |
|---|---|---|---|
| 4,386,139 | 5/1983 | Nakatsugawa | 428/607 |
| 4,387,006 | 6/1983 | Kajiwara et al. | 204/32 R |
| 4,686,017 | 8/1987 | Young | 204/45.1 |
| 4,834,842 | 5/1989 | Langner et al. | 204/1 T |
| 4,956,053 | 9/1990 | Polan et al. | 204/13 |
| 4,976,826 | 12/1990 | Tani et al. | 204/12 |
| 5,049,221 | 9/1991 | Wada et al. | 156/151 |
| 5,181,770 | 1/1993 | Brock et al. | 205/77 |
| 5,403,465 | 4/1995 | Apperson et al. | 205/77 |
| 5,421,985 | 6/1995 | Clouser et al. | 205/77 |
| 5,431,803 | 7/1995 | DiFranco et al. | 205/50 |

OTHER PUBLICATIONS

Fedot'ev, N. P., et al., Limit Of Strength And Microhardness Of Electrolytic Copper, Zhurnal Prikladnoi Khimii, vol. 37, No. 3, pp. 693–694 (Mar. 1964).

Heusner, Carl E., et al., Some Metallurgical Aspects Of Electrodeposits, Plating, vol. 35, pp. 554–561 and 577 (Jun. 1948).

Jernstedt, George W., Brighter Finishes Via P R Plating, Westinghouse Engineer, vol. 10, No. 3, pp. 139–143 (1943). No month available.

Jernstedt, George W., Leveling With PR Current Plating, Proc. Am. Electroplater's Soc., vol. 37, pp. 151–170 (1950). No month available.

Kuwako, Fujio, et al., A New Very Low Profile Electrodeposited Copper Foil, Technical Paper No. B 8/1 (Jun. 1990).

Lakshmanan, V. I., et al., The Effect Of Chloride Ion In The Electrowinning Of Copper, Journal of Applied Electrochemistry, vol. 7, pp. 81–90 (1977). No month available.

Lamb, Vernon A., et al., Physical And Mechanical Properties Of Electrodeposited Copper—I. Literature Survey, Plating, pp. 1289–1311 (Dec. 1965).

Lamb, Vernon A., et al., Physical And Mechanical Properties Of Electrodeposited Copper—II. The Sulfate Bath, Plating, pp. 86–95 (Jan. 1966).

Lamb, Vernon A., et al., Physical And Mechanical Properties Of Electrodeposited Copper—III. Deposits From Sulfate, Fluoborate, Pyrophosphate, Cyanide, And Amine Baths, Journal of the Electrochemical Society, vol. 117, No. 9, pp. 291C–318C (Sep. 1970).

Lowenheim, Frederick A., Modern Electroplating, The Electrochemical Society, Inc., John Wiley & Sons, Inc., Third Edition, pp. 194–197 (1974). No month available.

Lyde, D. M., Copper Pyrophosphate Plating, Metal Industry, vol. 101, pp. 82–84 (1962). No month available.

Wen, Ching Yu, et al., The Effect Of Organic And Inorganic "Addition–Agents" Upon The Electro–Deposition Of Copper From Electrolytes Containing Arsenic, General Meeting of the American Electro–Chemical Society, pp. 1–55 (Sep. 21–23, 1911).

Search Report for International Application No. PCT/JP97/01604, dated Aug. 19, 1997.

HIGH TENSILE STRENGTH ELECTRODEPOSITED COPPER FOIL AND PROCESS OF ELECTRODEPOSITING THEREOF

BACKGROUND OF THE INVENTION

This invention relates to electrodeposited copper foils such as are used to make "printed" circuits. In particular, the invention relates to a copper foil having a high tensile strength even after heating and characterized by having a low profile matte side and a unique crystal orientation, which provides more precisely etched circuit lines.

Electrodeposited copper foils are made by electrolysis of a copper solution. Typically, copper metal is deposited on a rotating metal drum which serves as the cathode. After the desired thickness has been achieved, the copper foil is removed from the drum and given post-treatments to protect it and to improve adhesion to a substrate. Then, the foil is wound into rolls for shipment to the user, where it is laminated to an insulating substrate, such as a glass fiber reinforced epoxy resin, and then photoimaged and etched to produce the desired circuit pattern. The etching process is critical to the actual performance of the circuit. Ideally, only copper not intended to be a part of the circuit pattern should be removed by the chemicals used to etch the copper. In fact, the copper is removed irregularly and instead of circuit lines having sharply defined sides, they are typically trapezoidal in shape. The top of the circuit lines are usually narrower than intended and the bottom wider. Furthermore, small amounts of copper may be left embedded in the substrate which are in electrical contact with the circuit lines. While some of these deficiencies can be countered by the circuit designer, who expects that etching will not be entirely accurate, nevertheless, one can appreciate that inaccurate etching will limit the spacing of the circuit lines. When they are too close together, short circuits can occur or the current passing through one circuit line can influence adjacent circuit lines. Consequently, accurate etching is important if increased circuit densities are to be achieved. However, the results of etching are largely influenced by the structure of the copper foils.

The invention is particularly useful in the tape automated bonding process (TAB), but it has application in conventional printed circuit boards. The need for higher circuit densities has been growing in TAB applications and next-generation TAB tapes should accommodate 320 channel, 50 μm pitch (spacing) circuits. Thus, more precise etching becomes ever more essential, to provide adequate insulation between the circuit lines and to produce sharply defined profiles.

Another problem to which TAB tapes are subject is that in multi-layer tapes the high temperatures used (about 180° C.) causes a drop in the tensile strength of the copper. This can result in bending of the inner leads. Thus, higher tensile strength copper foils are desirable in addition to the improved etching character discussed above.

Three related patents can be mentioned as having some relevance to the present invention. They are U.S. Pat. Nos. 5,403,465; 5,421,985; and 5,431,803. In each patent, conditions are changed in the electrolytic process in order to change the tensile strength, the elongation, and the roughness of the copper surface. In the '803 patent it is disclosed that under certain conditions uniform randomly oriented grains can be made and that columnar crystals can be avoided. While such foils proved improved tensile strength they have not been found to provide improved etchability for making fine lines and spaces.

The present inventors had as an objective improving the etching factor of copper foil, to reduce the surface roughness on the matte side of the foil, and to increase tensile strength. They have accomplished their objectives, as will be seen in the discussion below.

SUMMARY OF THE INVENTION

In one aspect, the invention is an electrodeposited copper foil which has a matte side roughness Rz of 2.5 μm or below and having an ambient tensile strength of 40 kgf/mm$^2$ or greater (measured after heating at 180° C.). Such electrodeposited copper foils have copper crystals which are found by x-ray diffraction analysis to have atomic cells with predominantly a (111) structure (a Miller index).

A copper foil of the invention will contain 50 to 1,200 ppm wt of tin and 1 to 50 ppm wt of iron.

The invention also is a process for making the improved electrodeposited copper foils just described which is characterized by using an electrolytic bath of copper sulfate and sulfuric acid containing 0.01 to 0.10 g/l of a polyether glycol, 0.5 to 1.0 g/l of tin ions, 0.5 to 5.0 g/l of iron ions, and less than 0.1 mg/l (wt ppm) of choride ions. In a preferred embodiment, the polyether glycol is polyethylene glycol (PEG), the tin ion is derived from stannous sulfate, and the iron ion is derived from ferrous sulfate heptahydrate.

DESCRIPTION OF THE PREFERRED EMBODIMENTS

Etching of Copper Foils

As previously explained, after copper foils are laminated to an insulating substrate circuit patterns are made by photoimaging the pattern on the foil and the etching away of the unwanted portions of the copper to leave circuit lines. The circuit designer would prefer that these circuit lines have a rectangular cross-sectional shape. However, the chemical etchants are not fully confined within the pattern defined by the photo-resist. They attack copper and remove it. Consequently, depending on the type of etchant and the time it is in contact with the copper the shape of the circuit line will be affected.

Figure 1A:
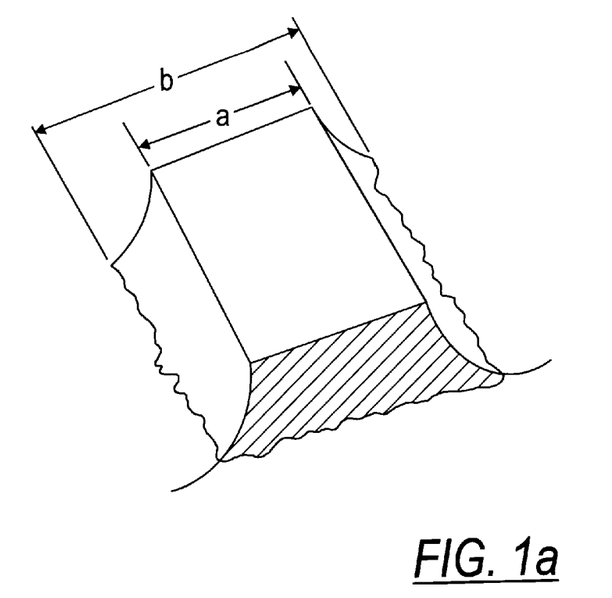
FIGS. 1(a) and 1(b) are drawings illustrating typical etched circuit lines.
Figure 1B:
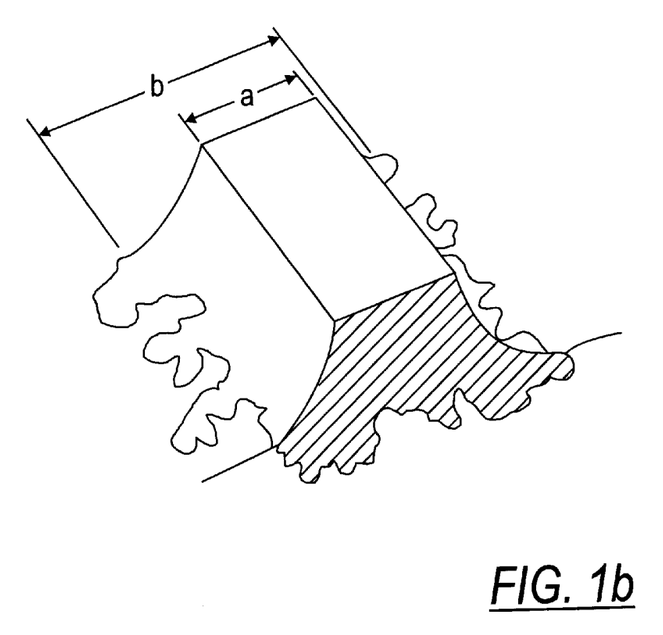

FIG. 1 illustrates sections of typical circuit lines. In (a) the bottom of the circuit line is reasonably linear. It will be understood that, since the bottom of the circuit line next to the substrate is exposed to the etchant for a shorter time than the top, there is a tendency to form the trapezoidal shape shown. FIG. 1(b) illustrates a poorly etched circuit line in which the top has become narrower because the etchant removed copper under the edges of the protective layer representing the circuit pattern. The bottom edge of the line is poorly defined.

Figure 6:
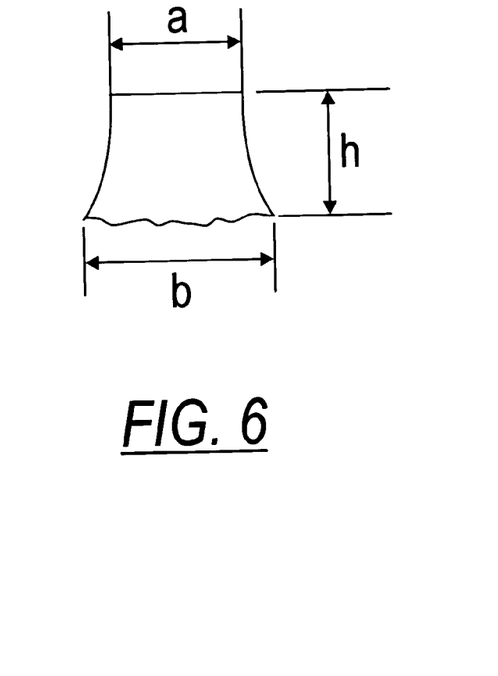
FIG. 6 is a diagram of the model used to calculate etching factor.

The term "etching factor" will be defined below. It provides a method of comparing the accuracy of etching. The method used is also shown in FIG. 6. The definition of the edges of the circuit lines is determined by measurements according to FIG. 7, as will be discussed below in the Examples.

Making Electrodeposited Copper Foil

Foils are made on a commercial scale by electrodepositing copper from solution onto a rotating metal drum. Copper ions are supplied by dissolving copper metal in sulfuric acid. The electrolytic solution is circulated between the drum (the cathode) and a closely-spaced anode. An appropriate voltage is applied and the copper is deposited on the drum with a suitable current density. Other materials are usually present in the electrolytic solution, some intentionally added and others which enter as impurities from various sources, including the copper metal which is dissolved to make up the solution. Since copper is continually removed from the solution as it is plated out on the drum, the solution is circulated and may be purified to remove impurities so they do not accumulate. Makeup copper is added and the concentration of other desired ingredients are adjusted as necessary so that the copper foil is consistent in quality. It is important in the present invention that the composition of the electrolytic bath be controlled carefully so that copper foil having the desired crystal structure and roughness is obtained. Copper foils have a smooth (shiny) side formed next to the drum surface and a matte side (rough) which was in contact with electrolytic solution. In most cases, the matte side is laminated to a substrate since the rougher side of the foil adheres better than the smooth side. It is one characteristic of foils of the invention that the matte side roughness is unusually low, 2.5 μm Rz or less. Ordinary foils have much higher Rz values.

The electrolytic bath used to make copper foils of the invention preferably contains the following principal constituents:

| | |
|---|---|
| $CuSO_4.5\ H_2O$ | 283–334 g/l |
| $H_2SO_4$ | 110–200 g/l |
| Polyether | 0.01–1.10 g/l |
| Tin ion | 0.5–1.0 g/l |
| Iron ion | 0.5–5.0 g/l |
| Chloride ion | <0.1 mg/l |

As will be seen in the examples below, the inventors have found that the amounts of the minor constituents are important if the desired foil properties are to be obtained. The quality of the surface roughness and the tensile strength are strongly influenced by the chloride ion content. The tensile strength at ambient temperatures is increased at low chloride concentrations and the surface roughness is decreased. The maximum should be 0.1 mg/l (0.1 wt. ppm). In commercial practice this is difficult to do because chloride ions are present in water and in the metallic copper used to prepare the solutions.

A polyether glycol is included in a low concentration. It affects the tensile strength. At least 0.01 g/l is needed to maintain the improved tensile strength while more than 0.10 g/l will increase the surface roughness of the foil. Polyethers glycols may be defined by the generic formula where:

R is lower alkyl n is an integer up to about 200

A preferred polyether glycol is polyethylene glycol (mw 400–6000)

Copper foils have their tensile strength measured at ambient temperatures, as made and after heating at 180° C. which may cause a change in the crystal structure and typically reduces the tensile strength. Since the copper foil will ordinarily be exposed to high temperatures during manufacture of printed circuits, this later tensile strength is important, particularly when making multilayer TAB tapes where internal leads can be bent. The inventors have found that the addition of small amounts of tin ions to the electrolytic solution will provide a significant increase in the tensile strength after the foil has been heated to 180° C. There should be at least 0.5 g/l in order to obtain a significant increase in tensile strength, but if the amount exceeds about 1.0 g/l then the surface roughness is increased beyond 2.5 μm Rz.

It has been found that the concentration of iron ions in the electrolytic solution affects the surface roughness. Iron should be present in an amount of at least 0.5 g/l. Above about 5 g/l the current efficiency is reduced, although the surface roughness could be reduced further.

When an electrolytic solution according to the invention is used, the electrical current density should be in the range of about 30 to 100 $A/dm^2$, preferably about 40–65 $A/dm^2$, in order to produce a copper foil having a surface roughness Rz no greater than 2.5 μm. The operating temperature should be in the range of 35 to 60° C., preferably 45–55° C. Under these conditions, the copper foil not only has a relatively smooth matte side, but has a high tensile strength after heating at 180° C. The copper crystals have atomic cells with predominantly a (111) orientation. This is believed to be the result of distributing tin oxide particles of about 20 to 50° A in the copper. The resulting copper is very fine grained. Such copper foils provide significantly improved etching characteristics and retain a high tensile strength when exposed to high temperatures during processing into printed circuits. They are especially useful in TAB tape applications. As will be understood by those familar with metals, various crystallographic structures within metals and alloys may be described by Miller indices (e.g. (111), which provide a means of indicating the orientation of atomic cells within a crystal structure. (For example, see *McGraw-Hill Dictionary of Scientific and Technical Terms*, 4th ed. McGraw-Hill, Inc., 1989).

Since tin and iron compounds are added to the electrolytic bath to control surface roughness and tensile strength after heating to 180° C., they will appear also in the finished foil. Typically, they will amount to about 50 to 1,200 wt. ppm of tin and about 1 to 50 wt. ppm iron. They may be added to the electrolytic bath as soluble iron and tin compounds, such as ferrous sulfate heptahydrate and stannous sulfate.

EXAMPLE 1

Figure 2:
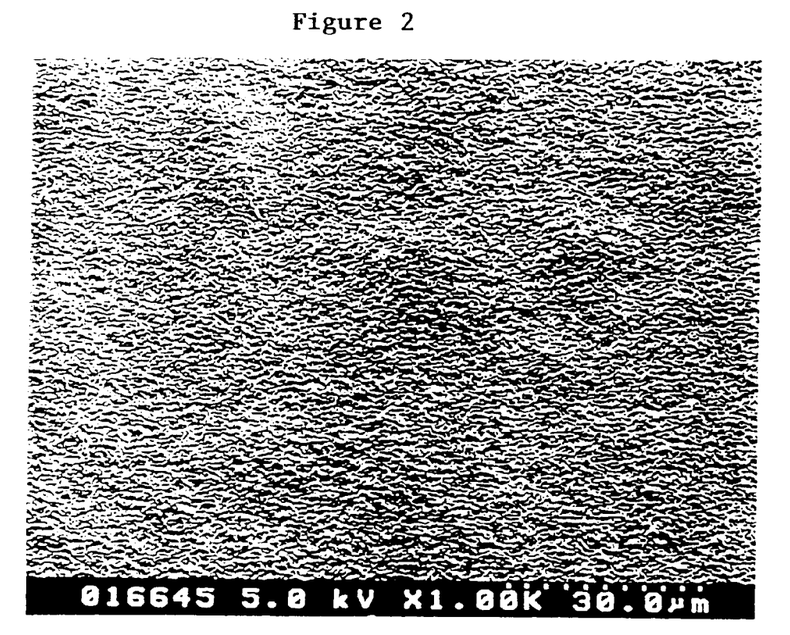
FIG. 2 is an SEM photograph of the surface of the foil of the invention from Example 1.
Figure 8A:
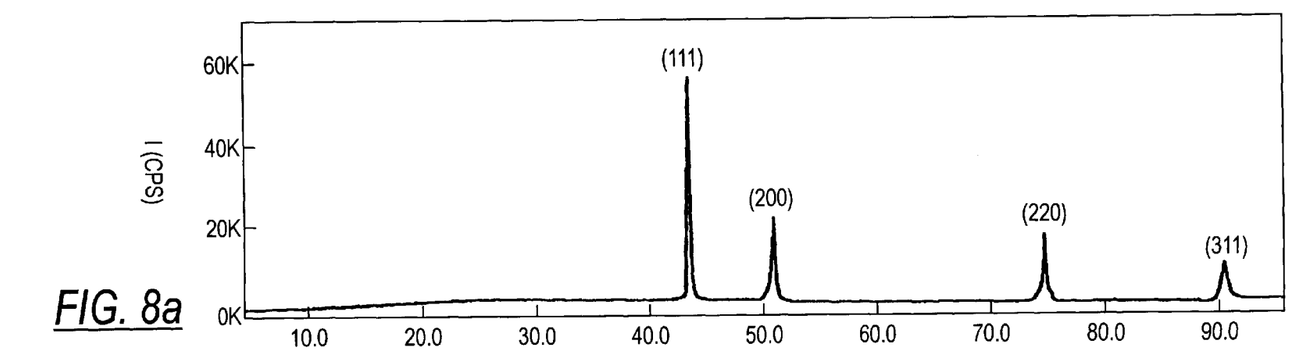
FIGS. 8(a) and 8(b) show two x-ray diffraction charts, 8(a) for Example 1 and 8(b) for Comparative Example 1.

An 18 μm thick copper foil was made by electrodepositing copper using a current density of 40–65 $A/dm^2$ and a temperature of about 45–55° C. The electrolytic solution contained 314 g/l of copper as $CuSO_4.5\ H_2O$, 150 g/l of sulfuric acid, 0.1 g/l of polyethylene glycol (6000 mw), 0.5 g/l of tin ion from stannous sulfate, and 1 g/l of iron from ferrous sulfate heptahydrate. The foil produced had a surface roughness Rz of 2.5 μm on the matte side (measured by a commercial profilometer) and an ambient tensile strength of 41.1 $kgf/mm^2$ after heating at 180° C. for one hour. The matte side of this foil is shown in FIG. 2, a photomicrograph taken with a scanning electron microscope (SEM). The very fine surface roughness can be clearly seen. FIG. 8(a) shows the results of an x-ray diffraction examination of the foil produced in this example, which shows that it contains copper crystals having a major fraction of atomic cell planes with a (111) configuration. The remaining configurations, (220), (200) and (311) are found in smaller amounts.

A TAB tape was made by bonding the matte side of the foil to a polyimide substrate after giving the copper foil a conventional treatment to improve adhesion. A fine circuit pattern having a pitch of 50 µm was made from the copper foil bonded to the polyimide film by conventional etching. Examination of the circuit lines showed them to be very sharply defined with only a small variation in width from the top to the bottom. Further, the definition of the bottom of the circuit lines was satisfactory.

Figure 4:
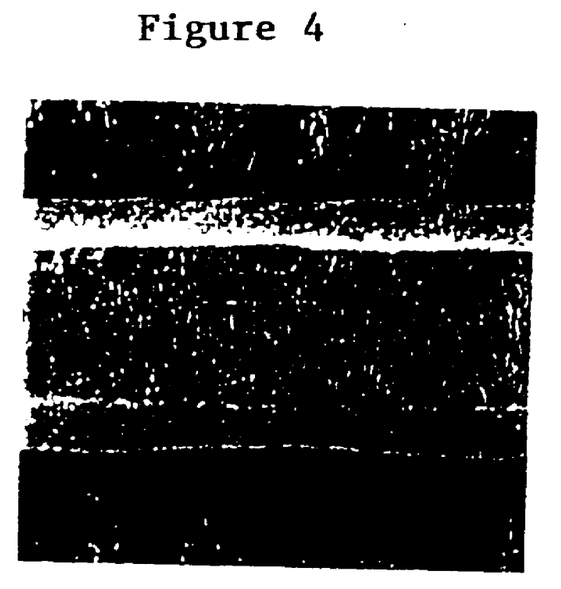
FIG. 4 is an SEM photograph of the 50 μm pitch circuit lines of Example 1.
Figure 7:
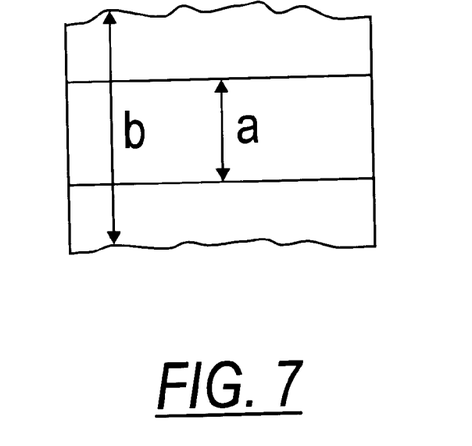
FIG. 7 is a diagram of the model used to calculate the linearity of the etched circuit lines.

A further assessment of the quality of the circuit lines was made by measurements made using a photograph taken with 1000× magnification using an S-4100 scanning electron microscope (Hitachi Ltd.). See FIG. 4. The method used is illustrated in FIG. 7. A line was drawn parallel to the edge of the circuit line at the top and bottom. The width of the top and bottom of the line (a and b) was measured at 10 points along the line at intervals of 10 µm. The standard deviation of the width measurements was used to define the straightness of the top and bottom of the circuit. The results of this evaluation are shown in Table 1 below, where they are compared with circuit lines made using a foil according to Comparative Example 1.

The etching factor was also determined for these circuit lines. This represents a calculation of a numerical value which indicates the degree to which the circuit line approaches the ideal cross-sectional shape. The etching factor is determined by making the measurements shown in FIG. 6 and calculating the etching factor as Ef=2h/ b−a. Where the base b and the top a are the same, then the etching factor becomes infinite. In practice, the base b is usually wider than the top a and Ef is a small positive number. Typically the base is wider than the top of the circuit line since the top is exposed to the etching agent for a longer period, thus creating a trapezoidal cross-section rather than the ideal rectangular one. As with the measurement of the width described above, 10 points were measured and the standard deviation of the values determined. The results are found in Table 1 below. It will be seen that the etching factor of the foil of the invention was larger and the standard deviation smaller than those of the conventional foil of Comparative Example 1. The bending of inner leads on the TAB tape was determined using an optical microscope. No bending was found with this Example 1, but some bending was found with the foil of Comparative Example 1.

Comparative Example 1

Figure 3:
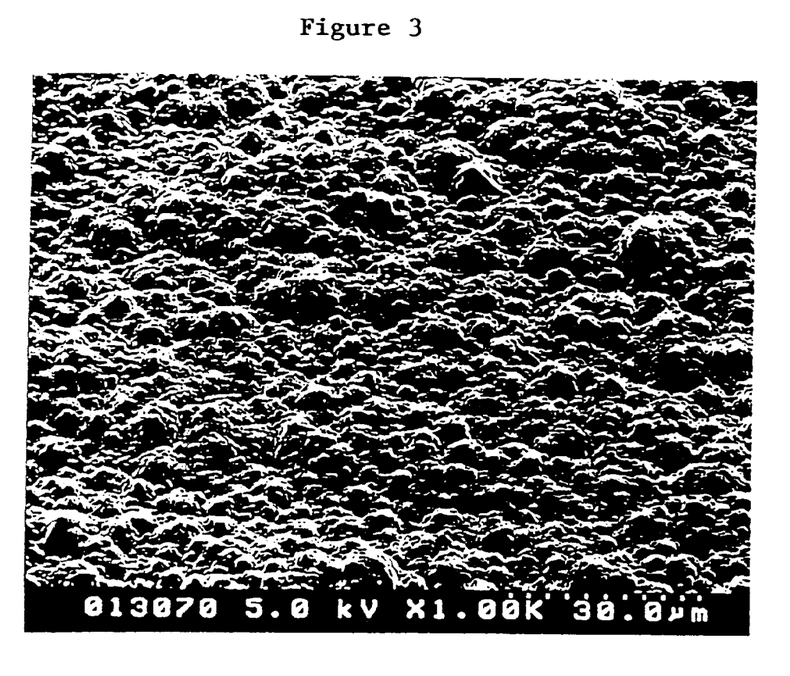
FIG. 3 is an SEM photograph of the surface of the foil from Comparative Example 1.
Figure 8B:
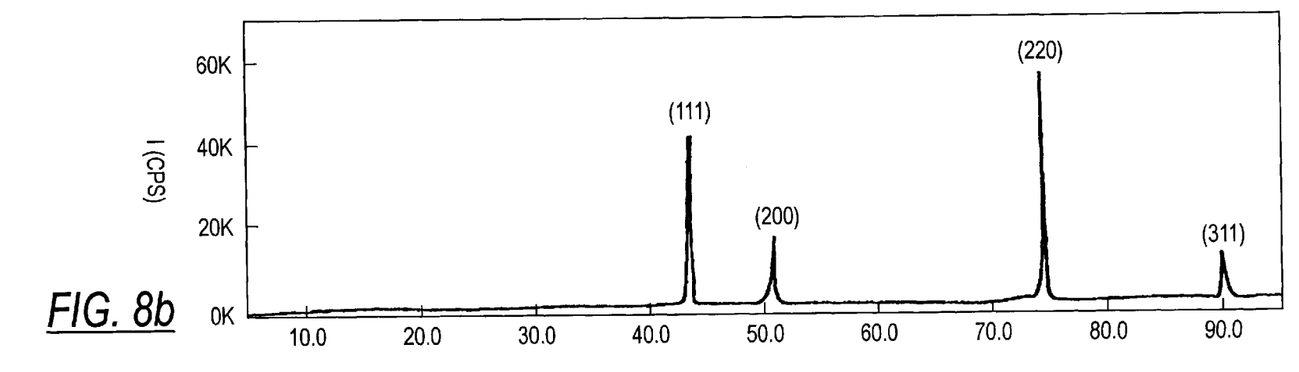

A TAB tape was made in the same manner as Example 1 except that, instead of a foil of the invention, another 18 µm thick foil was used which was developed by Mitsui Mining & Smelting for use in making circuits with a fine pitch. This foil, designated VLP, had a matte side roughness of 3.8 µm Rz. Its tensile strength after heating for one hour at 180° C. was 48 kgf/mm². The matte surface of the VLP foil can be seen in FIG. 3 and compared with that of the foil of the invention shown in FIG. 2. The difference in roughness is clear. The X-ray diffraction analysis is shown in FIG. 8(b) where it can be seen that the predominent crystal atomic cell plane orientation is (220) rather than (111) in the foil of the invention, although other orientations are present.

Figure 5:
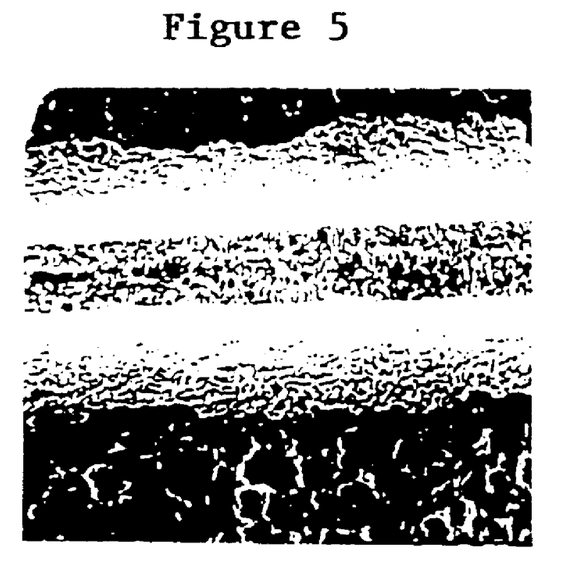
FIG. 5 is an SEM photograph of the 50 μm pitch circuit lines of Comparative Example 1.

A TAB tape was made using the same procedures as in Example 1 and the quality of the circuit lines evaluated in the same manner as Example 1. It was found that the circuit lines were less well defined as can be seen in FIG. 5. The results of the evaluation are shown in Table 1 where they can be compared with the results obtained with the foil of the invention. The VLP foil made circuit lines which were less precise, having a poorer etching factor and greater variation from a straight line than were found with circuit lines made with the foil of Example 1.

TABLE 1

|  | Ex. 1 | Comp Ex. 1 |
| --- | --- | --- |
| Average Top Width, µm | 13.4 | 6.5 |
| Average Bottom Width, µm | 22.3 | 24.4 |
| Etching Factor, Ef | 4 | 2 |
| Std. Deviation of Bottom from straight line | 0.12 | 1.16 |
| Std. Deviation of Top from straight line | 0.12 | 0.20 |
| Surface Roughness Rz µm | 2.5 | 3.8 |
| Bending of inner lead | None | partial |
| Post-Heating Tensile Strength, kgf 1 mm² | 41.1 | 48.0 |

EXAMPLES 2–5 and COMPARATIVE EXAMPLES 2–7

A series of copper foils were made using a current density of about 50–65 A/dm² and a bath temperature of about 45–55° C. The composition of the electrolytic bath was varied to examine the effects of changing the amounts of the polyether and the tin and iron ions. Except for Comparative 7 each electrolytic bath contained less than 0.1 ppm wt of chloride ion. The copper foils produced were examined for their surface roughness and their tensile strength, both at ambient temperature, as made and after being heated for one hour at 180° C. The results of these tests are shown in Table 2, which also includes the results for the foil of Example 1 and Comparative Example 2.

TABLE 2

|  | Examples |  |  |  |  | Comparative Examples |  |  |  |  |  |  |
| --- | --- | --- | --- | --- | --- | --- | --- | --- | --- | --- | --- | --- |
|  | 1 | 2 | 3 | 4 | 5 | 1 | 2 | 3 | 4 | 5 | 6 | 7 |
| Electrolytic Bath |  |  |  |  |  |  |  |  |  |  |  |  |
| CuSO₄.5H₂O, g/l | 314 | 314 | 314 | 314 | 314 | — | 314 | 314 | 314 | 314 | 314 | 314 |
| H₂SO₄, g/l | 150 | 150 | 150 | 150 | 150 | — | 150 | 150 | 150 | 150 | 150 | 150 |
| Polyether, g/l | 0.01 | 0.01 | 0.05 | 0.10 | 0.10 | — | — | 0.01 | 0.05 | 0.10 | — | — |
| Tin, g/l | 0.5 | 0.5 | 0.5 | 1.0 | 1.0 | — | — | — | — | — | — | — |
| Iron, g/l | 1.0 | 0.5 | 1.0 | 1.0 | 5.0 | — | 1.0 | 1.0 | 1.0 | 1.0 | — | — |
| Cl, ppm | <0.1 | <0.1 | <0.1 | <0.1 | <0.1 | — | <0.1 | <0.1 | <0.1 | <0.1 | <0.1 | 1 |
| Foil Properties |  |  |  |  |  |  |  |  |  |  |  |  |

TABLE 2-continued

|  | Examples | | | | | Comparative Examples | | | | | | |
| --- | --- | --- | --- | --- | --- | --- | --- | --- | --- | --- | --- | --- |
|  | 1 | 2 | 3 | 4 | 5 | 1 | 2 | 3 | 4 | 5 | 6 | 7 |
| Tensile Strength, kgf/mm + 2 | | | | | | | | | | | | |
| ambient | 52.0 | 55.7 | 54.01 | 54.0 | 53.8 | 52.0 | 64.6 | 71.2 | 70.2 | 70.01 | 53.0 | 46.3 |
| after 180° C. | 41.1 | 40.5 | 40.8 | 48.8 | 48.5 | 48.0 | 30.1 | 30.1 | 29.5 | 29.6 | 28.0 | — |
| Elongation, % | | | | | | | | | | | | |
| ambient | 4.5 | 4.8 | 4.5 | 4.5 | 4.7 | 7.0 | 3.8 | 3.7 | 4.2 | 4.2 | 4.9 | 13.2 |
| after 180° C. | 6.6 | 6.2 | 7.6 | 5.6 | 5.9 | 6.0 | 13.8 | 15.5 | 15.0 | 16.2 | 15.0 | — |
| Matte Side Roughness, Rz µm | 2.5 | 2.4 | 2.5 | 2.4 | 2.5 | 3.8 | 2.1 | 2.0 | 2.1 | 2.0 | 4.5 | 9.6 |

Several conclusions can be drawn from the data presented in Table 2. Addition of tin to the electrolysis bath appears to decrease the tensile strength of the copper foil at ambient temperature, but to reduce the loss of tensile strength after heating to 180° C. The elongation of the copper foil is lower than conventional foil. Iron appears to reduce surface roughness (see Comparative 6). Chloride ion also affects surface roughness (see Comparative 7).

It is believed that the copper foils of the invention are superior because the changes to the composition of the electrolysis bath cause the planes in the atomic cells of the copper crystals to be oriented differently than in more conventional foils. As shown in FIG. 8 the new foils have their crystals with (111) orientation predominant. This may account for the reduced surface roughness and may help to explain why the new foils can be etched more accurately.

We claim:

1. A process of electrodepositing copper foil having a matte side roughness Rz of 2.5 µm or less and atomic cells with a (111) orientation as measured by x-ray diffraction by electrodepositing of said copper foil from a copper solution containing copper ions, 0.01 to 0.10 g/l of a polyether glycol, 0.5 to 1.0 g/l of tin ions, 0.5 to 5.0 g/l of iron ions, and less than 0.1 mg/l chloride ion at a current density of about 30–100 A/dm$^2$.

2. A process of claim 1 wherein said polyether glycol is selected from compounds having the formula HO-(R—O)$_n$-H where R is lower alkyl and n is an integer greater than zero and up to about 200.

3. A process of claim 2 wherein said glycol is polyethylene glycol.

4. A process of claim 1 wherein said tin ions are derived from stannous sulfate.

5. A process of claim 1 wherein said iron ions are derived from ferrous sulfate heptahydrate.

6. A process of claim 1 wherein said electrodeposition is carried out with a current density of about 40–65 A/dm$^2$ and at a temperature of about 35 to 60° C.

* * * * *